(12) United States Patent
Dobbins et al.

(10) Patent No.: US 10,600,730 B2
(45) Date of Patent: Mar. 24, 2020

(54) CROSS TALK REDUCTION DIFFERENTIAL CROSS OVER ROUTING SYSTEMS AND METHODS

(71) Applicant: NVIDIA Corporation, Santa Clara, CA (US)

(72) Inventors: Jim Dobbins, Santa Clara, CA (US); Sheetal Jain, Santa Clara, CA (US); Don Templeton, Santa Clara, CA (US); Yaping Zhou, Santa Clara, CA (US); Wenjun Shi, Santa Clara, CA (US); Sunil Sudhakaran, Santa Clara, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 0 days.

(21) Appl. No.: 15/881,622

(22) Filed: Jan. 26, 2018

(65) Prior Publication Data

US 2019/0237399 A1    Aug. 1, 2019

(51) Int. Cl.
  *H01L 23/522* (2006.01)
  *H01L 21/768* (2006.01)
  *H01L 23/66* (2006.01)

(52) U.S. Cl.
  CPC .... *H01L 23/5221* (2013.01); *H01L 21/76895* (2013.01); *H01L 23/66* (2013.01); *H01L 2223/6638* (2013.01)

(58) Field of Classification Search
  CPC .............................. H01L 23/5221; H01L 23/66
  USPC ................................................. 333/5; 257/691
  See application file for complete search history.

(56) References Cited

U.S. PATENT DOCUMENTS

| 8,624,687 | B2 | 1/2014 | Ye |
| 9,069,910 | B2 | 6/2015 | Zhang et al. |
| 9,240,619 | B2 * | 1/2016 | Howard ................. H01P 1/184 |
| 9,293,798 | B2 | 3/2016 | Ye |
| 9,785,601 | B2 | 10/2017 | Mohammad et al. |
| 10,122,122 | B2 * | 11/2018 | Heistand, II ....... H01R 13/6469 |
| 2005/0056455 | A1 * | 3/2005 | Masu ..................... H01P 3/088 |
| | | | 174/117 FF |
| 2009/0189708 | A1 | 7/2009 | Merritt |
| 2010/0184307 | A1 | 7/2010 | Arai et al. |

(Continued)

OTHER PUBLICATIONS

Danny Boesing; The Sky's The Limit—New Elevated, High Speed Mezzanine Interconnect System; Blog; Aug. 3, 2015; 12 pages; SAMTEC.

(Continued)

*Primary Examiner* — David Vu
*Assistant Examiner* — Brandon C Fox
(74) *Attorney, Agent, or Firm* — Zilka-Kotab, PC

(57) ABSTRACT

In one embodiment, a system comprises: a plurality of aggressor bus lines; and a plurality of differential pair bus lines that are located in relatively parallel close proximity to the plurality of aggressor bus lines, wherein at least two of the plurality of differential pair bus lines change location with respect to each other at a point that has a cancelling affect on cross talk from the plurality of aggressor bus lines, wherein the change includes cross over routing. The plurality of differential pair bus lines can convey differential clock signals. The routing of the plurality of differential pair bus lines is substantially parallel to one another before and after the change.

17 Claims, 7 Drawing Sheets

(56) References Cited

U.S. PATENT DOCUMENTS

2012/0161893 A1* 6/2012 Ye ............................ H01P 3/026
                                                                    333/5
2016/0094272 A1* 3/2016 Ye ............................ H04B 3/32
                                                                    375/257
2017/0285683 A1* 10/2017 Lin ..................... G06F 13/4022

OTHER PUBLICATIONS

I. Hatirnaz and Y. Leblebici; Twisted Differential On-Chip Interconnect Architecture For Inductive/Capacitive Crosstalk Noise Cancellation; Feb. 26, 2004; S; 4 pages; wiss Federal Institute of Technology Microelectronic Systems Laboratory.

* cited by examiner

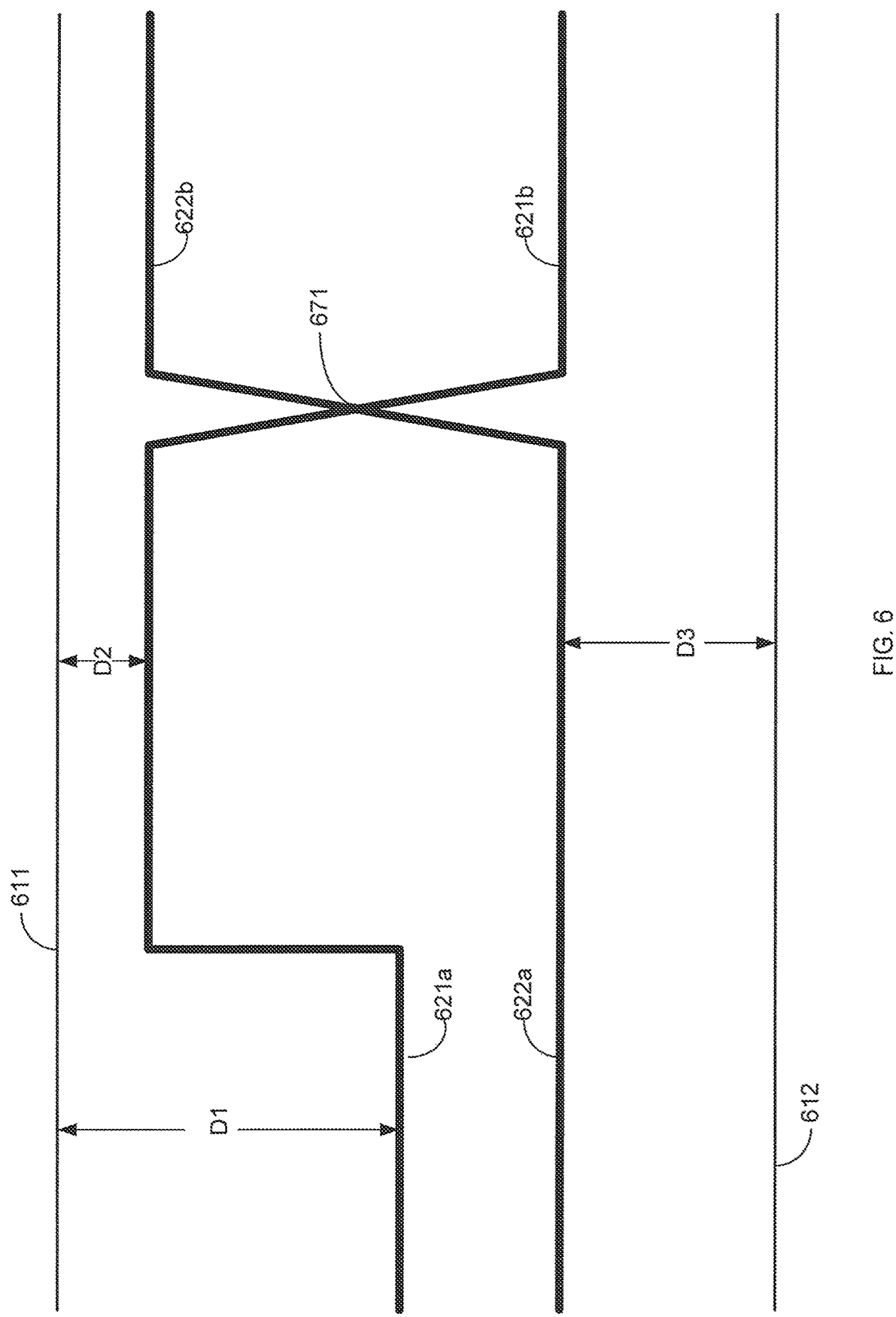

710
Forming a first portion of a first trace line substantially parallel to an aggressor trace line with a first distance between the first portion of the first trace line and the aggressor trace line.

720
Forming a first portion of a second trace line substantially parallel to an aggressor trace line with a second distance between the first portion of the second trace line and the aggressor trace line.

730
Forming a crossover point between the first trace line and the second trace line, wherein the crossover occurs at a point that has a cancelling affect on cross talk from the aggressor trace line, wherein first trace line and second trace line convey respective differential clock signals.

740
Forming a second portion of the first trace line substantially parallel to the aggressor trace line with the second distance between the second portion of the first trace line and the aggressor trace line.

750
Forming a second portion of the second trace line substantially parallel to the aggressor trace line with the first distance between the second portion of the second trace line and the aggressor trace line.

FIG. 7

CROSS TALK REDUCTION DIFFERENTIAL CROSS OVER ROUTING SYSTEMS AND METHODS

FIELD OF THE INVENTION

The present invention relates to integrated circuit fabrication and signal cross talk reduction.

BACKGROUND

Numerous electronic technologies such as digital computers, video equipment, and telephone systems have facilitated increased productivity and reduced costs in processing information in most areas of business, science, and entertainment. The electronic systems often include integrated circuits that process signals. Accurate signal processing is important for proper performance. However, there are a number of factors that can impact accurate signal processing. Oscillating signals are often affected by cross talk noise and signal interference, which in-turn typically cause various performance issues (e.g., signal quality issues, timing issues, etc.). The interference can become increasingly problematic in high density areas. Conventional parallel routed signal conductors are often susceptible to cross talk noise that interferes with critical functions (e.g., a high speed differential clock, strobe, etc.). Traditionally, signal conductors that are susceptible to interference are referred to as victims, and signal conductors that generate or propagate the noise are typically referred to as aggressors.

SUMMARY

Systems and methods that facilitate cross talk interference reduction are presented. In one embodiment, a system comprises: a plurality of aggressor bus lines; and a plurality of differential pair bus lines that are located in relatively parallel close proximity to the plurality of aggressor bus lines, wherein at least two of the plurality of differential pair bus lines change location with respect to each other at a point that has a cancelling affect on cross talk from the plurality of aggressor bus lines, wherein the change of location includes cross over routing and the plurality of differential pair bus lines convey differential clock signals. The routing of the plurality of differential pair bus lines is substantially parallel to one another before and after the change of location. The cross talk between the positive pin and a negative pin can be reduced or minimized. In one exemplary implementation, each one of the plurality of differential bus lines in a pair are coupled to a positive pin and a negative pin. The plurality of differential pair of bus lines can convey strobe signals. The plurality of signals can see a substantially equal amount of ground surface and have similar amounts of capacitance. The plurality of signal bus lines can have similar cross sections and lengths. The plurality of signal bus lines can have similar resistances. A trace line in the differential pair can have a different length in a first path before the crossover and a second path after the crossover. In one exemplary implementation, the system is included in an integrated circuit. The system can be included in a high speed signal distribution circuit of an integrated circuit.

In one embodiment, a method of fabricating a high speed signal distribution circuit in an integrated circuit comprises: forming a first portion of a first trace line substantially parallel to an aggressor trace line with a first distance between the first portion of the first trace line and the aggressor trace line; forming a first portion of a second trace line substantially parallel to an aggressor trace line with a second distance between the first portion of the second trace line and the aggressor trace line; forming a crossover point between the first trace line and the second trace line, wherein the crossover occurs at a point that has a cancelling affect on cross talk from the aggressor trace line, wherein the first trace line and second trace line convey respective differential clock signals; forming a second portion of the first trace line substantially parallel to the aggressor trace line with the second distance between the second portion of the first trace line and the aggressor trace line; and forming a second portion of the second trace line substantially parallel to the aggressor trace line with the first distance between the second portion of the second trace line and the aggressor trace line.

BRIEF DESCRIPTION OF THE DRAWINGS

The accompanying drawings, which are incorporated in and form a part of this specification and in which like numerals depict like elements, illustrate embodiments of the present disclosure and, together with the description, serve to explain the principles of the disclosure.

FIG. 6 is a block diagram of an exemplary differential pair with an uneven distance crossover point in accordance with one embodiment.

FIG. 7 is a block diagram of an exemplary fabrication method in accordance with one embodiment.

DETAILED DESCRIPTION OF THE INVENTION

Figure 1:
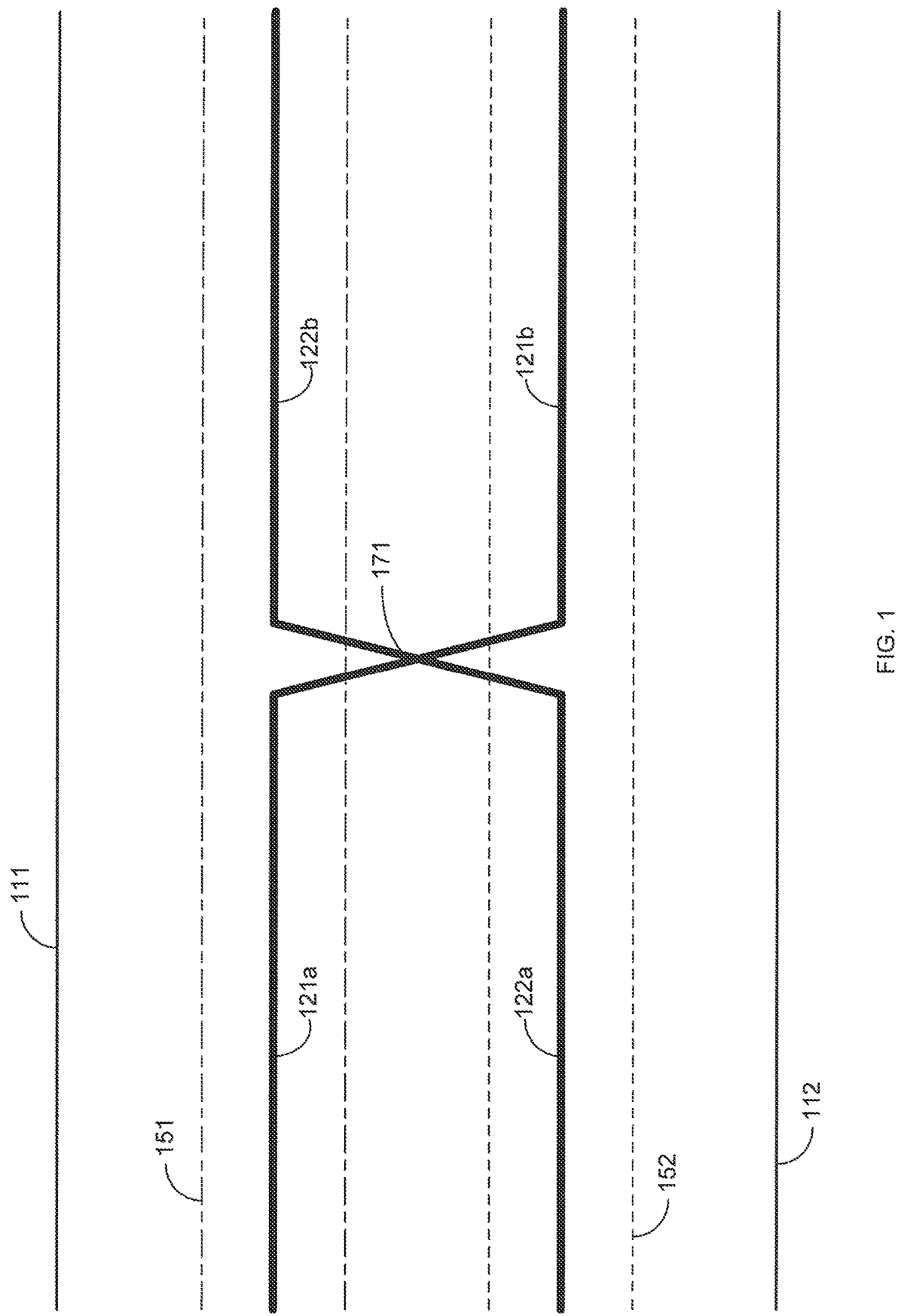
FIG. 1 is a block diagram of an exemplary system in accordance with one embodiment.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one ordinarily skilled in the art that the present invention may be practiced without these specific details. In other instances, well known methods, procedures, components, and circuits have not been described in detail as not to unnecessarily obscure aspects of the current invention.

Systems and methods to reduce adverse impacts due to noise and cross talk interference are presented. In one embodiment, a configuration or characteristic of a portion of a victim trace line is configured to compensate for interference affects. In one exemplary implementation, the proximity of a victim trace line with respect to an aggressor trace line is altered. The configuration change can reduce an impact of cross talk noise from an aggressor. In one embodiment, the victim trace line is included in a differential pair of trace lines. The differential pair can be coupled to a receiving component that responds or reacts to a difference between the two trace lines included in the differential pair. Utilizing the difference between the two signals in a differential pair can help mitigate the adverse consequences of cross talk noise as opposed to an un-paired conductor and a fixed reference (e.g., ground, etc.) because the more the noise impacts the conductors, similarly the greater the chance that an original difference is maintained and thus the lower the impact of the noise. The first signal conveyed via a first trace line and a second signal conveyed via the second trace line can have the same or different characteristics (e.g., phases, frequencies, amplitudes, etc.).

The configuration or characteristic of a portion of a victim trace line in the differential pair can be altered so that an impact of cross talk noise from an aggressor lead is reduced. In one embodiment, the configuration of a victim trace in the differential pair is altered so that adverse effects or influence of noise due to cross talk from an aggressor trace line are cancelled out with respect to the difference in signals communicated via the differential pair. In one embodiment, a first trace line and second trace line are included in a differential pair, wherein a first portion of a first trace line is located a first distance from an aggressor line, a first portion of a second trace line is located a second distance from the aggressor line, a second portion of the first trace line is located the second distance from the aggressor line, and a second portion of the second trace line is located the first distance from the aggressor line.

The characteristics (e.g., location, size, etc.) of trace lines in a differential pair can be swapped or interchanged so that adverse noise influence on the difference between the signals on the differential pair trace lines is substantially reduced or cancelled. In one embodiment, the location or proximity of a portion of a first trace line with respect to an aggressor is swapped or interchanged with the location or proximity of a portion of a second trace line. The change or adjustment of location can include a crossover in which a first trace line and a second trace line crossover one another. In one exemplary implementation, the adjustment includes arranging the trace lines in locations with respect to one another such that interference in a differential pair is reduced. In one embodiment, the two trace lines of a differential pair change location with respect to each other at a point that has a cancelling affect on cross talk from an aggressor trace line. In one embodiment, a victim trace line is located in relatively close parallel proximity to an aggressor trace line. In one exemplary implementation, close parallel proximity to an aggressor is sufficiently close and parallel enough for cross talk interference to be created or induced on a victim trace line.

In one embodiment, interference on a portion of a differential pair trace line is approximately equal and opposite of interference on another portion of the differential pair trace line. In one exemplary implementation, interference on a portion of a differential pair trace line is approximately equal and similar to interference on another portion of the differential pair trace line. The differential pair can convey a first clock signal and second clock signal respectively. The first and second clock can have a mesochronous relationship. In one exemplary implementation, the two trace lines of a differential pair change location with respect to each other at a point that has a cancelling affect on cross talk from the plurality of aggressor bus lines. It is appreciated that the cancelling affect can reduce adverse effects or impacts associated with cross talk interference without necessarily absolutely cancelling the cross talk. In one embodiment, the cancelling affect is sufficient to avoid a level of cross talk interference that impacts system performance or results.

The change or adjustment of location can include a crossover in which a first trace line following a first path crosses over a second trace line and follows the second path, while the second trace line following the second path crosses over the first trace line and follows the first path. FIG. 1 is a block diagram of trace line configurations in accordance with one embodiment. Aggressor trace lines 111 and 112 are located relatively close to victim trace lines 121 and 122. The victim trace lines 121 and 122 run substantially parallel to one another and to aggressor lines 111 and 112 before and after the cross over. In one exemplary implementation, the victim trace lines 121 and 122 are differential pair trace lines. The trace lines 121 and 122 cross over one another at cross over point 171. In one embodiment, the differential pair trace lines essentially swap path locations. The paths 151 and 152 are substantially parallel to one another and equal in length. Trace line portion 121*a* is in path 151 and trace line portion 121*b* is in path 152, while after the cross over trace line portion 122*a* is in path 152 and trace line portion 122*b* is in path 151.

Figure 2:
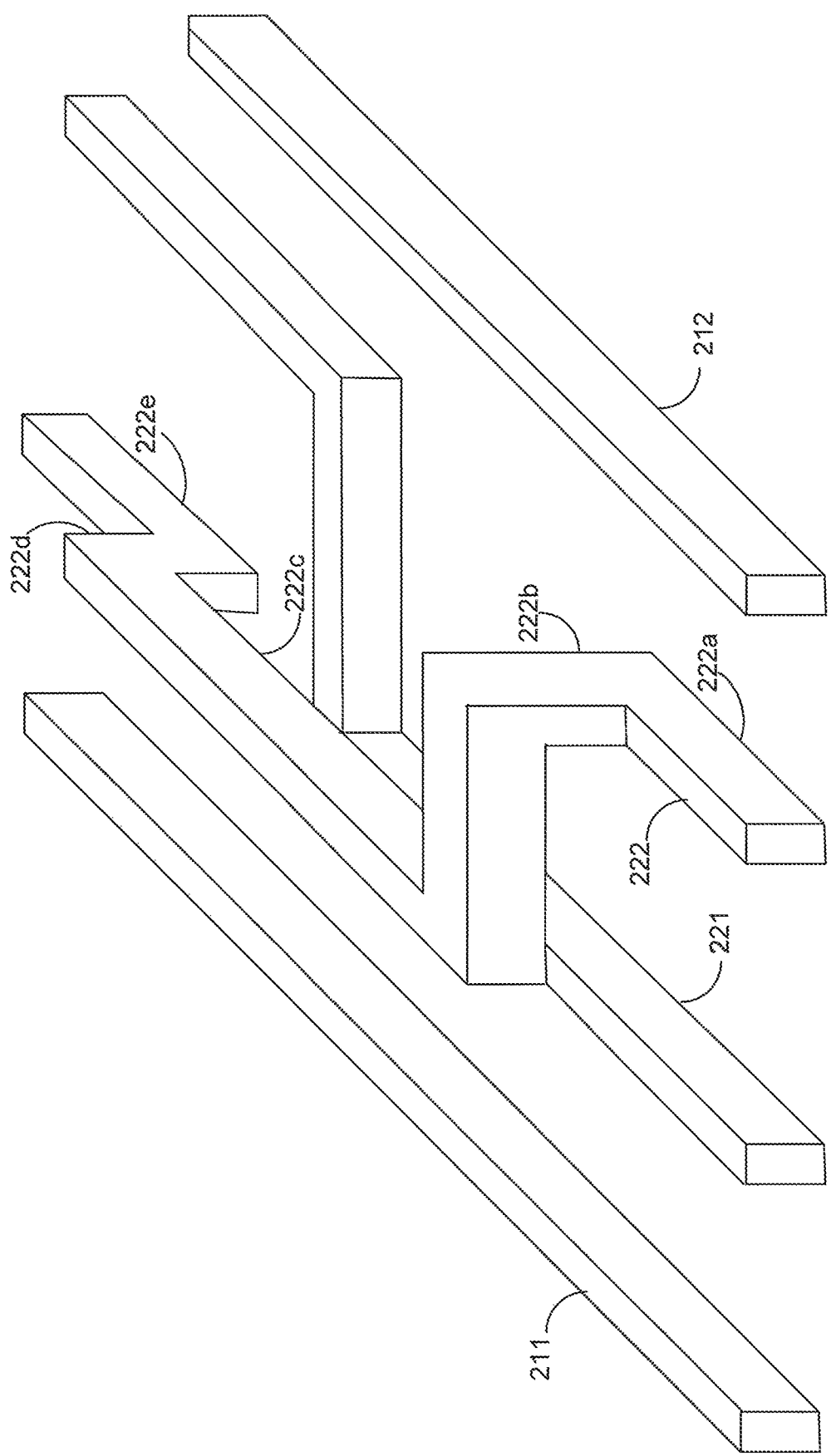
FIG. 2 is a block diagram of an exemplary differential pair configuration adjustment in accordance with one embodiment.

FIG. 2 is a block diagram of an exemplary differential pair configuration adjustment in accordance with one embodiment. The differential pair includes trace lines 221 and 222 which are located relatively close to aggressor traces 211 and 212. The trace lines 221 and 222 run substantially parallel to one another and to aggressor lines 221 and 222 before and after the cross over. The traces 221 and 222 in the differential pair cross over one another. In one embodiment, the differential pair essentially swap path locations. The crossover can include transitions between planes or levels. In one exemplary implementation, trace line 222 includes portions 222*a*, 222*b*, 222*c*, 222*d*, and 222*e*. The trace line portion 222*a* is at a first level or plane, 222*b* is a via up to a second level which includes portion 222*c*, and 222*d* is a via back down to the first level that includes portion 222*e*. In one exemplary implementation, the differential pair is included in an interposer layer.

Figure 3:
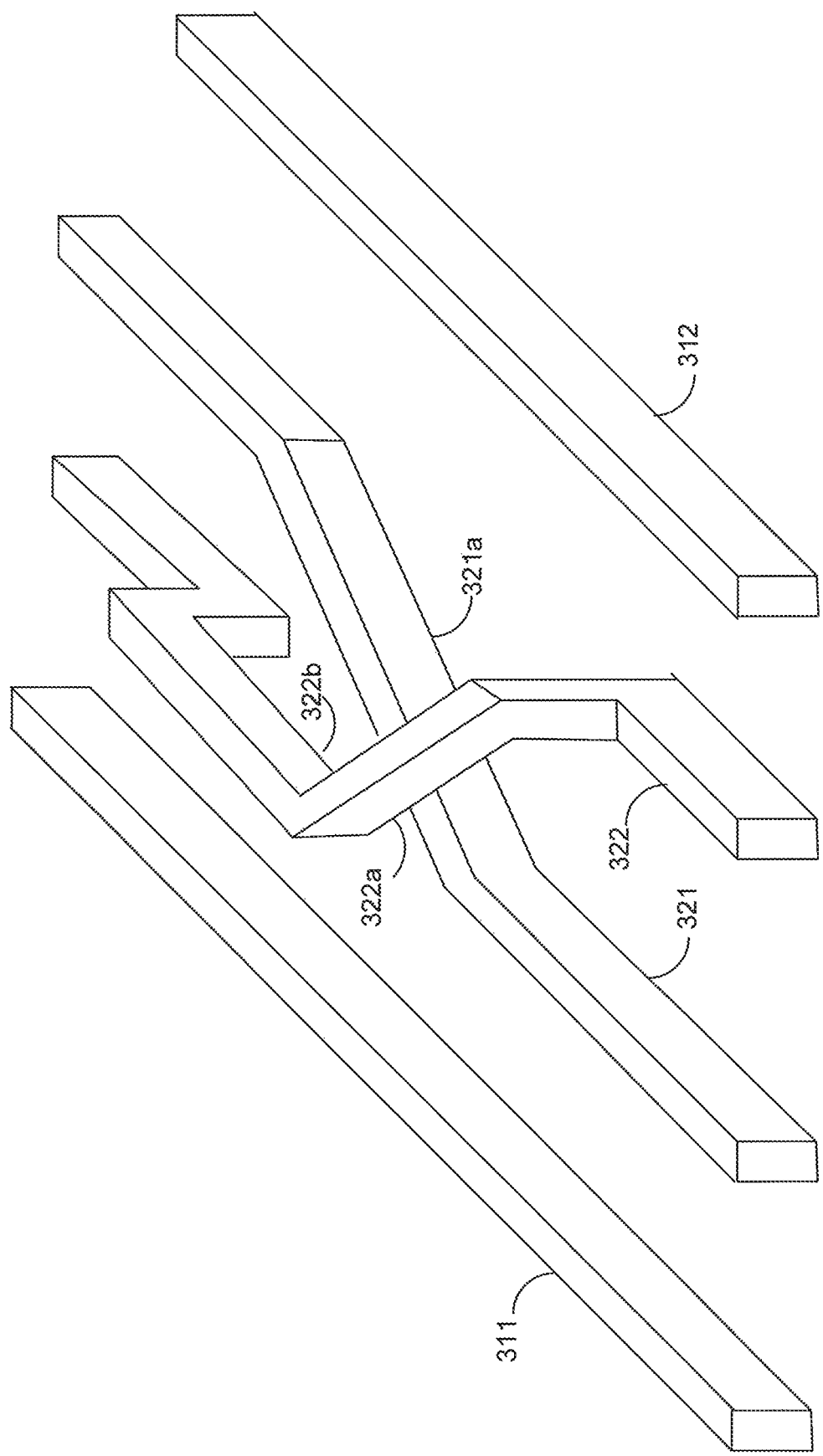
FIG. 3 is a block diagram of an exemplary implementation with a gradual crossover in accordance with one embodiment.

It is appreciated the cross over can have various configurations. The crossover can be substantially perpendicular or approximately 90 degrees as illustrated in FIG. 2. The crossover can be gradual. FIG. 3 is a block diagram of an exemplary implementation with a gradual crossover. The differential pair includes trace lines 321 and 322. The differential pair is located relatively close to aggressor traces 311 and 312. The differential pair trace lines 321 and 322 run substantially parallel to one another and to aggressor lines 321 and 322 before and after the cross over. The trace lines 321 and 322 in the differential pair cross over one another gradually. In one embodiment, the crossover can include a portion (e.g., 321*a*, etc.) that is approximately 45 degrees from the original path direction. The crossover can include multiple portions (e.g., 322*a*, 322*b*, etc.) that are at different angles to the original path.

Figure 4:
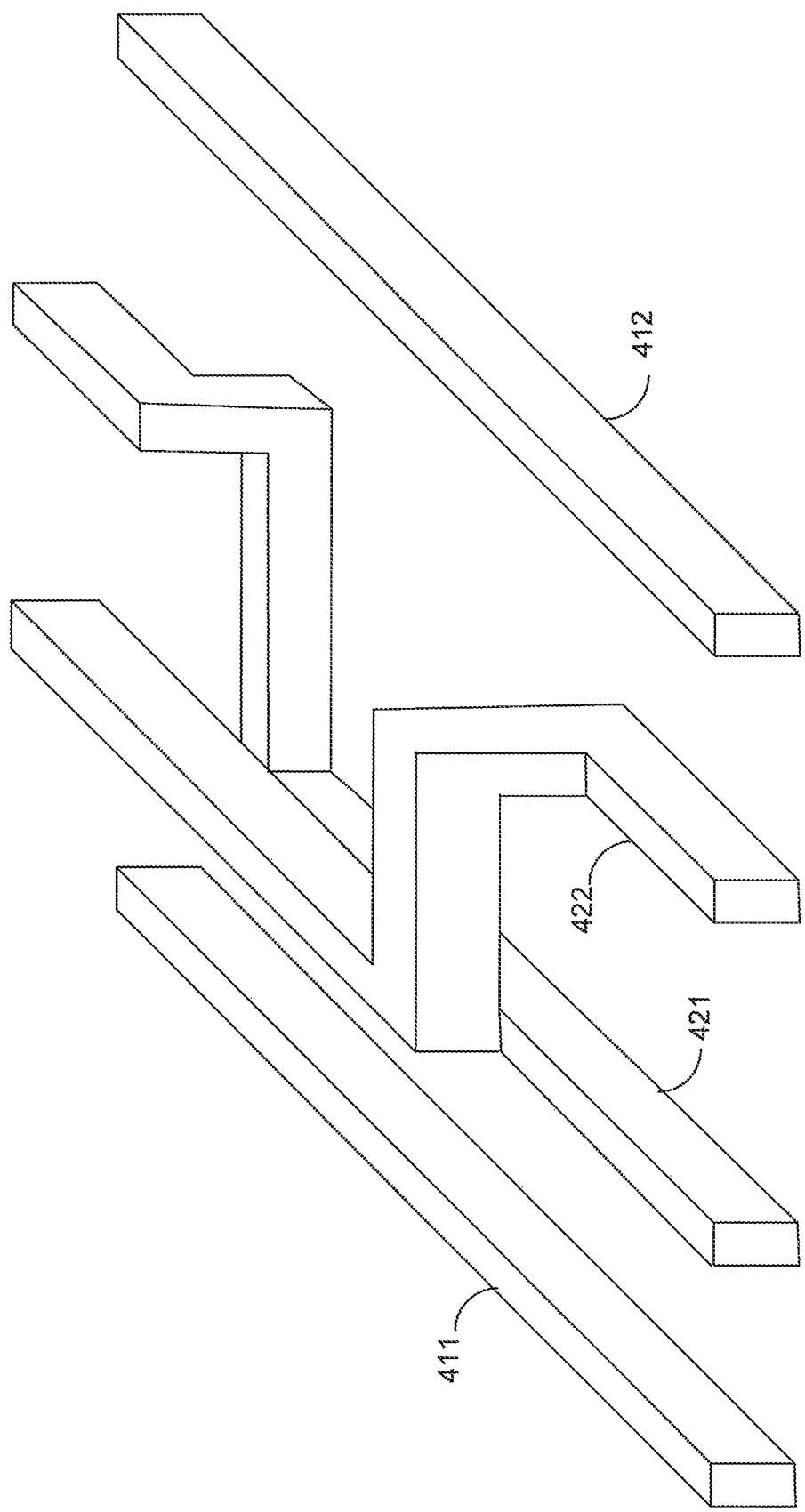
FIG. 4 is a block diagram of an exemplary implementation in which the differential pair run in different layers in accordance with one embodiment.

FIG. 4 is a block diagram in which the differential pair run in different layers in accordance with one embodiment. The crossover is part of a change in layers. The differential pair includes trace lines 421 and 422. The differential pair is located relatively close to aggressor traces 411 and 412. The differential pair trace lines 421 and 422 run substantially parallel to one another and to aggressor lines 411 and 412 before and after the cross over. The traces 421 and 422 in the differential pair cross over one another as part of a level change and run in different levels before and after the crossover.

In one exemplary implementation, the adjustment includes arranging the differential pair traces in locations with respect to one another such that interference in the differential pair is reduced. In conventional systems, signal conductor traces or bus lines can see different levels of cross talk due to differences in distance from an aggressor. The presented cross-over routing can efficiently and effectively cancel or reduce cross talk from aggressors routing in parallel. The differential pair of clock (or strobe) can run parallel half way then use transition structures to swap their location relative to aggressors. The rest of the routing is parallel again with substantially uniform spacing. By this kind of arrangement, cross talk from the same aggressor can cancel each other as seen by the differential pair.

In one embodiment, the differential pair run in two substantially parallel paths comprising a first path and a second path. While other things being equal, the crossovers points are configured so that approximately the total distance of a first trace line of the differential pair in the first path is approximately equal to the total distance of the first trace line of the differential pair in the second path. The cross talk noise can be cancelled (e.g., as seen from differential positive to negative pin, etc.) because the same or similar amount of cross talk noise from both signals is received by the differential pair's positive and negative pins. With reference back to FIG. 1, differential pair 121 and 122 crossover approximately in the middle of their respective path lengths.

It is appreciated the presented systems and methods are compatible with differential pairs that are located in densely configured areas in which multiple aggressors and multiple victims in close proximity to one another. The differential pairs can be located in interposal areas or interposal designs. The differential pairs can be utilized in various applications. In one exemplary implementation, the differential pair is located in a high bandwidth memory (e.g., HBM3, etc.).

Figure 5:
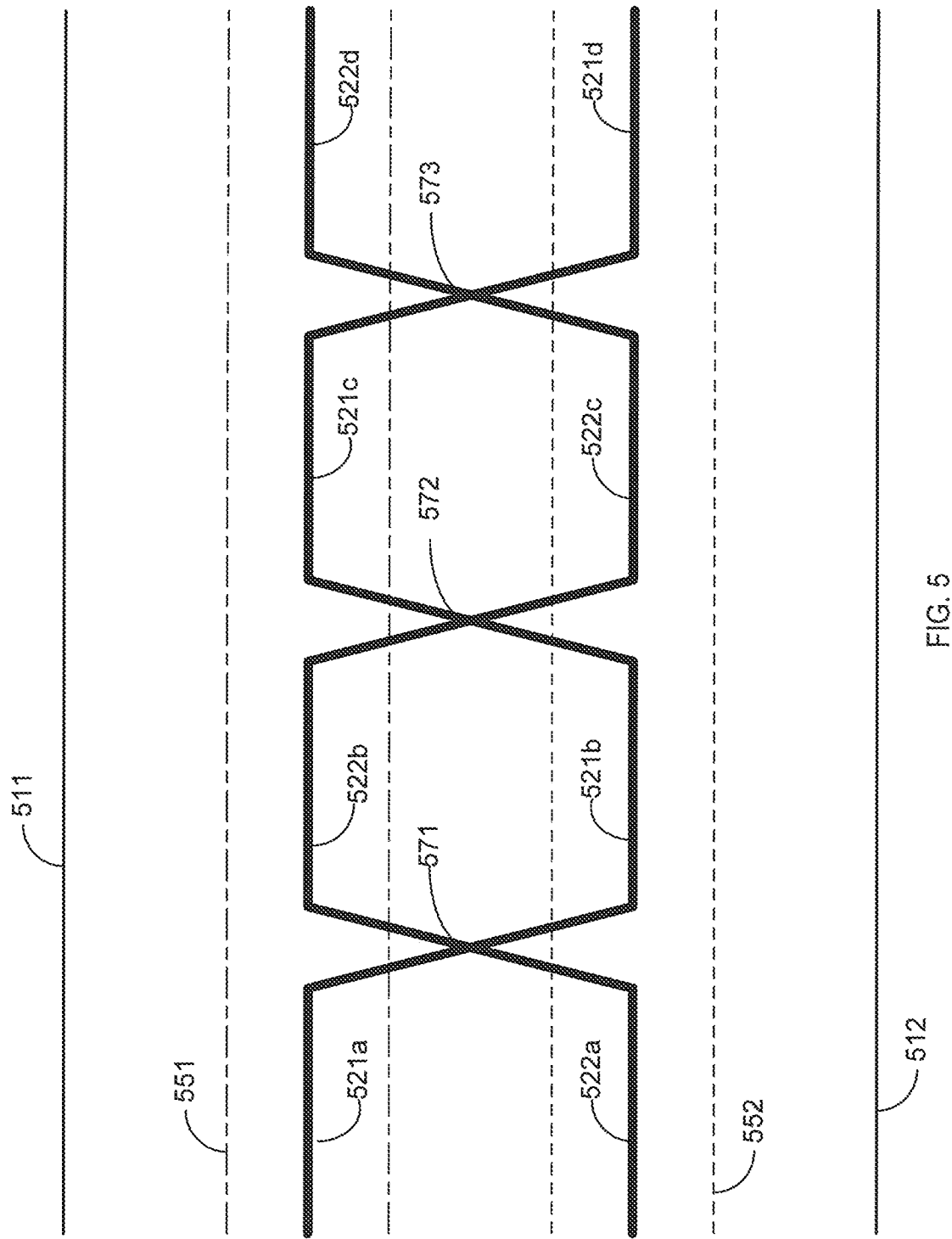
FIG. 5 is a block diagram of an exemplary differential pair with multiple crossovers.

FIG. 5 is a block diagram of an exemplary differential pair with multiple crossovers. In one embodiment, the crossovers are configured so that the sum of the distances of a trace in a first path are approximately equal to the sum of the trace distances in the second path. Aggressor trace lines 511 and 512 are located relatively close to victim trace lines 521 and 522. The victim trace lines 521 and 522 run in paths 551 and 552 substantially parallel to one another and to aggressor lines 511 and 512 before and after the cross over. In FIG. 5 differential pair trace lines 521 and 522 crossover three times at crossover points 571, 572 and 572, with each cross over occurring approximately at a quarter of the total path distance. Trace line portions 521*a*, 521*b*, 521*c* and 521*d* are substantially equal in length with trace line portions 521*a* and 521*c* running in path 551 and trace line portions 521*b* and 521*d* running in path 552. Trace line portions 522*a*, 522*b*, 522*c* and 522*d* are substantially equal in length with trace line portions 522*a* and 522*c* running in path 552 and trace line portions 522*b* and 522*d* running in path 551.

It is appreciated that the distance of a trace in respective paths can vary. FIG. 6 is a block diagram of an exemplary differential pair with an uneven distance crossover point. In one embodiment, the crossovers are configured so that the sum of the distances of a trace in a first path are not equal to the sum of the trace distances in the second path. Aggressor trace lines 611 and 612 are located relatively close to victim trace lines 621 and 622. The victim trace lines 621 and 622 run in paths 651 and 652 substantially parallel to one another and to aggressor lines 621 and 622 before and after the cross over. However, distances D1, D2, and D3 are not equal. Thus, the impact of the aggressor lines 611 and 622 are not equal and the crossover point location is adjusted to compensate for the difference in crosstalk interference associated with the different distances D1, D2, and D3. In FIG. 6 differential pair trace lines 621 and 622 crossover at crossover point 671, with the cross over not occurring in the middle of the total path distance. Trace line portions 621*a* and 622*a* are not equal in length to trace line portions 621*b* and 621*b*.

In one exemplary implementation, victim trace line aspects other than the proximity to an aggressor trace line (e.g., length, width height, material composition, etc.) are held substantially unchanged. In another exemplary implementation, the alterations can include changes to various aspects of the victim trace line. In one exemplary implementation, the location of a first trace line is adjusted with respect to the location of a second trace line. In one exemplary implementation, the points at which the locations of the plurality of differential pair bus lines change result in the plurality of differential pair bus lines being on one side of an aggressor approximately half of the length of the differential pair bus lines and on the other side of the aggressor for approximately the other half of the length of the differential pair bus lines.

FIG. 7 is a block diagram of fabrication method in accordance with one embodiment.

In block 710, a first portion of a first trace line is formed substantially parallel to an aggressor trace line with a first distance between the first portion of the first trace line and the aggressor trace line. In one embodiment, the first trace line is a trace line of a differential pair and conveys a first differential clock signal.

In block 720, a first portion of a second trace line is formed substantially parallel to an aggressor trace line with a second distance between the first portion of the second trace line and the aggressor trace line. In one embodiment, the second trace line is a trace line of a differential pair and conveys a first differential clock signal.

In block 730, a crossover point is formed between the first trace line and the second trace line.

In block 740, a second portion of the first trace line is formed substantially parallel to the aggressor trace line with the second distance between the second portion of the first trace line and the aggressor trace line.

In block 750, a second portion of the second trace line is formed substantially parallel to the aggressor trace line with the first distance between the second portion of the second trace line and the aggressor trace line. In one exemplary implementation, a second portion of the second trace line substantially parallel to the aggressor trace line with the first distance between the first portion of the second trace line and the aggressor trace line Thus, trace lines or bus lines are configured to compensate for interference effects. The location of a first trace line is adjusted with respect to the location of a second trace line and can include a crossover in which a first trace line and a second trace line crossover one another. The adjustment can include arranging the trace lines in locations with respect to one another such that interference in the differential pair is reduced. The switchover change with respect to each other has a cancelling affect on cross talk from an aggressor trace line. The cross over routing can effectively reduce cross talk, which can facilitate increases in voltage and timing margins.

Some portions of the detailed descriptions are presented in terms of procedures, logic blocks, processing, and other symbolic representations of operations on data bits within a computer memory. These descriptions and representations are the means generally used by those skilled in data processing arts to effectively convey the substance of their work to others skilled in the art. A procedure, logic block, process, etc., is here, and generally, conceived to be a self-consistent sequence of steps or instructions leading to a desired result. The steps include physical manipulations of physical quantities. Usually, though not necessarily, these quantities take the form of electrical, magnetic, optical, or quantum signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

In one embodiment, the components or configurations are described as having a characteristic or feature (e.g., equal, similar, parallel, coincident, etc.). It is appreciated the components and configurations can be designed or intended to have the characteristics and configurations within acceptable deviation parameters. The deviation parameters can correspond to manufacturing characteristics or limits.

It should be borne in mind, however, that all of these and similar terms are associated with the appropriate physical quantities and are merely convenient labels applied to these quantities. Unless specifically stated otherwise as apparent from the following discussions, it is appreciated that throughout the present application, discussions utilizing terms such as "processing", "computing", "calculating", "determining", "displaying" or the like, refer to the action and processes of a computer system, or similar processing device (e.g., an electrical, optical or quantum computing device) that manipulates and transforms data represented as physical (e.g., electronic) quantities. The terms refer to actions and processes of the processing devices that manipulate or transform physical quantities within a computer system's components (e.g., registers, memories, other such information storage, transmission or display devices, etc.) into other data similarly represented as physical quantities within other components.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as suited to the particular use contemplated. It is intended that the scope of the invention be defined by the Claims appended hereto and their equivalents. The listing of steps within method claims do not imply any particular order to performing the steps, unless explicitly stated in the claim.

What is claimed:

1. A high speed signal distribution circuit in an integrated circuit, wherein the distribution circuit comprises:
   a plurality of aggressor bus lines; and
   a plurality of differential pair bus lines that are located in relatively parallel close proximity to the plurality of aggressor bus lines, wherein at least two of the plurality of differential pair bus lines change location with respect to each other at a point that has a cancelling affect on cross talk from the plurality of aggressor bus lines, wherein the change includes cross over routing and the plurality of differential pair bus lines convey differential clock signals, wherein signals on the plurality of differential pair bus lines:
   include respective resistances,
   see a substantially equal amount ground surface, and
   have respective amounts of capacitance,
   wherein the respective capacitances and respective resistances are similar enough so that a cancelling effect on cross talk between the plurality of differential pair bus lines at least partially avoids adverse interference impacts on system performance and results.

2. The high speed signal distribution circuit in an integrated circuit of claim 1, wherein the routing of the plurality of differential pair bus lines is substantially parallel to one another before and after the change.

3. The high speed signal distribution circuit in an integrated circuit of claim 1, wherein each one of the plurality of differential pair bus lines in a pair are coupled to a positive pin and a negative pin.

4. The high speed signal distribution circuit in an integrated circuit of claim 3, wherein the adverse interference impacts between the positive pin and the negative pin is minimized.

5. The high speed signal distribution circuit in an integrated circuit of claim 1, wherein the plurality of differential pair bus lines convey strobe signals.

6. The high speed signal distribution circuit in an integrated circuit of claim 1, wherein the plurality of signal bus lines have cross sections and lengths that support preservation of similarity in the respective resistances.

7. The high speed signal distribution circuit in an integrated circuit of claim 1, wherein a trace line in the differential pair has a first path before the crossover and a second path after the crossover, wherein the first path before the crossover and the second path after the crossover have different lengths.

8. A method of fabricating a high speed signal distribution circuit in an integrated circuit, wherein the distribution circuit comprises:
   forming a first portion of a first trace line substantially parallel to an aggressor trace line with a first distance between the first portion of the first trace line and the aggressor trace line;
   forming a first portion of a second trace line substantially parallel to the aggressor trace line with a second distance between the first portion of the second trace line and the aggressor trace line;
   forming a crossover point between the first trace line and the second trace line, wherein the crossover occurs at a point that has a cancelling affect on cross talk from the aggressor trace line, wherein the first trace line and the second trace line convey respective differential clock signals;
   forming a second portion of the first trace line substantially parallel to the aggressor trace line with the second distance between the second portion of the first trace line and the aggressor trace line; and
   forming a second portion of the second trace line substantially parallel to the aggressor trace line with the first distance between the second portion of the second trace line and the aggressor trace line, wherein the first trace line and the second trace line:
   include respective resistances,
   see a substantially equal amount ground surface, and
   have respective amounts of capacitances, wherein the respective capacitances and respective resistances are similar enough so that a cancelling effect on cross talk between the first trace line and the second trace line at least partially avoids adverse interference impacts on system performance and results.

9. The method of claim 8, wherein routing of the first trace line and second trace line is substantially parallel to one another before and after the change.

10. The method of claim 8, wherein the first trace line is coupled to a positive pin and the second trace line is coupled to a negative pin and cross talk between the positive pin and a negative pin is minimized.

11. The method of claim 8, wherein the first trace line and second trace line convey strobe signals.

12. An integrated circuit comprising:
   a plurality of aggressor trace lines including a first aggressor trace line and a second aggressor trace line;
   a first portion of a first trace line substantially parallel to the first aggressor trace line with a first distance between the first portion of the first trace line and the first aggressor trace line;
   a second portion of the first trace line substantially parallel to the second aggressor trace line with a second distance between the second portion of the first trace line and the first aggressor trace line,
   a first portion of a second trace line substantially parallel to the second aggressor trace line with a third distance between the first portion of the second trace line and the second aggressor trace line, wherein the first distance and third distance are not equal; and
   a crossover point between the first trace line and the second trace line, wherein the crossover occurs at a point that has a cancelling affect on cross talk interference from the first aggressor trace line and the second aggressor trace line, wherein the crossover point location is configured to compensate for the difference in the first distance and the third distance.

13. The integrated circuit of claim 12 wherein the first distance and second distance are not equal and the crossover point location is configured to compensate for the difference in the first distance and the second distance.

14. The integrated circuit of claim 12 wherein the second distance and third distance are not equal and the crossover point location is configured to compensate for the difference in the second distance and third distance.

15. The integrated circuit of claim 12 further comprising a second portion of the second trace line substantially parallel to the first aggressor trace line with a fourth distance between the second portion of the second trace line and the first aggressor trace line.

16. The integrated circuit of claim 15 wherein the second distance and fourth distance are equal and the crossover point location is configured to compensate for the difference in the fourth distance and the second distance.

17. The integrated circuit of claim 15 wherein the second distance and fourth distance are not equal and the crossover point location is configured to compensate for the difference in the fourth distance and the second distance.

* * * * *